US006392481B1

(12) United States Patent
Kurttio

(10) Patent No.: US 6,392,481 B1
(45) Date of Patent: May 21, 2002

(54) METHOD AND APPARATUS FOR IMPROVED FED FORWARD AMPLIFICATION

(75) Inventor: Pasi Kurttio, Oulu (FI)

(73) Assignee: Nokia Networks Oy, Espoo (FI)

( * ) Notice: Subject to any disclaimer, the term of this patent is extended or adjusted under 35 U.S.C. 154(b) by 0 days.

(21) Appl. No.: 09/451,148

(22) Filed: Nov. 30, 1999

(51) Int. Cl.[7] ................................................. H03F 1/00
(52) U.S. Cl. .......................... 330/151; 330/149; 455/63
(58) Field of Search ................................ 330/149, 151, 330/126; 455/63

(56) References Cited

U.S. PATENT DOCUMENTS

| 1,686,792 A | | 10/1928 | Black | |
| 5,051,704 A | | 9/1991 | Chapman et al. | 330/52 |
| 5,334,946 A | | 8/1994 | Kenington et al. | |
| 5,444,418 A | * | 8/1995 | Mitzlaff | 330/52 |
| 5,594,385 A | * | 1/1997 | Anvari | 330/149 |
| 5,926,067 A | * | 7/1999 | Myer et al. | 330/52 |
| 6,078,216 A | * | 6/2000 | Proctor, Jr. | 330/151 |
| 6,166,601 A | * | 12/2000 | Shalom et al. | 330/151 |

FOREIGN PATENT DOCUMENTS

| EP | 0 675 594 A1 | 4/1995 |
| EP | 0 768 752 A1 | 4/1997 |
| EP | 0 774 833 A1 | 5/1997 |

OTHER PUBLICATIONS

Meyer, Eschenback, and Edgerley: "A Wide–Band Feedforward Amplifier" IEEE Journal Of Sold–State Circuits, Dec. 1974, vol. 8c–9, No. 6, pp. 422–428.
Narahashi and Nojima: "Extremely Low–Distortion Multi–Carrier Amplifier—Self Adjusting Feed–Forward (SAFF) Amplifier–" IEEE, 1991, pp. 1485–1490.
Myer: "A Multicarrier Feed–forward Amplifier Design" Microwave Journal, Oct. 1994, pp. 78, 83–84, 86, and 88.
Parsons, Kenington, and McGeehan: "Efficient Linearisation of RF Power Amplifiers For Wideband Applications" The Institution of Electrical Engineers, Published by IEE, London, 1994, 7 pages.
Konstantinou and Paul: "Analysis And Design Of Broadband, High Efficiency Feedforward Amplifiers" Department of Electrical Engineering & Electronics, University of Manchester Institute of Science & Technology, IEEE MTT–s Digest, 1996, pp. 867–870.

* cited by examiner

*Primary Examiner*—Robert Pascal
*Assistant Examiner*—Henry Choe
(74) *Attorney, Agent, or Firm*—Banner & Witcoff, Ltd.

(57) ABSTRACT

The quality and efficiency of producing an amplified signal output from a feed-forward amplifier system having reduced distortion and noise is provided. Multiple adjusters are included in the signal cancellation loop of a feed-forward amplifier system so as to more accurately adjust the different frequencies within a frequency band. For example, in a multi-carrier feed-forward amplifier system two or more adjusters are provided in the signal cancellation loop so as to provide more accurate adjustment for the various carriers rather than relying on a single adjuster to adjust for all carriers. According to one variation of the invention, two adjusters are provided in the signal cancellation loop of a two carrier multi-carrier feed-forward amplifier system. Each of the two adjusters adjusts a respective one of the two carriers. The outputs of the adjusters are combined and input to a delay element in the signal cancellation loop. According to another variation of the invention, the outputs of the adjusters are combined and input to the amplifier in the signal cancellation loop.

15 Claims, 3 Drawing Sheets

METHOD AND APPARATUS FOR IMPROVED FED FORWARD AMPLIFICATION

BACKGROUND OF THE INVENTION

1. Technical Field of the Invention

The present invention relates generally to electrical amplification, and more particularly to feed forward amplification.

2. Description of the Related Art

A feed-forward amplifier system was proposed by Harold S. Black in the 1920's as illustrated by his United States patent, U. S. Pat. No. 1,686,792, which is hereby incorporated by reference for all purposes. The feed-forward amplifier system design was intended to reduce amplifier distortion, e.g., inter-modulation distortion (IMD) of carrier signals (carriers) to thereby suppress cross-talk between multiple carriers. Since then various feed-forward amplifier system designs have been proposed for reducing amplifier distortion and noise. A number of examples of the various feed-forward amplifier designs is provided in U.S. Pat. No. 5,051,704 issued to Chapman et al., hereby incorporated by reference for all purposes. The feed-forward amplifier system is now well established and particularly useful in wideband and multi-carrier systems.

One particular example of a feed-forward amplifier system used for reducing distortion and noise is provided in FIG. 1. There is shown a feed-forward amplifier system having two different carrier signals, carrier signal 101 and carrier signal 102 having two different frequencies that are input into to node 110 where they produce combined signal 103. Combined signal 103 is provided through node 111 to an amplifier 112 and an adjuster 113. The output of amplifier 112 is provided through node 115 to a delay element 117 and to node 116. The output of adjuster 113 is input to delay element 114 and output therefrom to node 116. Node 111, amplifier 112, node 115, node 116, adjuster 113, and delay element 114 make up a signal cancellation loop 140. As such, ideally the output of the signal cancellation loop 140 from node 116 has had the signal of the combined carrier signals, signal 103, removed and contains only the distortion and noise produced as a result of imperfect amplification and inter-modulation products of amplifier 112. However, in some applications, for example wideband and multi-carrier amplifier systems, the carrier signals are not completely cancelled in the signal cancellation loop 140, because of non-ideal frequency response of the amplifier 112.

The output of node 115 is input to delay element 117 and the output of delay element 117 is input to node 120. The output of node 116 is input to adjuster 118. The output of adjuster 118 is input to amplifier 119 which amplifies the adjusted distortion and noise component, introduced to the signal by amplifier 112. The output of amplifier 119 is input to node 120. Node 115, node 116, adjuster 118, amplifier 119, delay element 117, and node 120 make up distortion cancellation loop 150 which operates to remove the distortion and noise component from the output signal of amplifier 112 to thereby produce amplified signal 104 reasonably free of noise and distortion introduced by amplifier 112.

In operation, the feed-forward amplifier system of FIG. 1 operates to remove the distortion, e.g., IMD, and noise that would normally occur as a result of the non-ideal characteristics and inter-modulation products of amplifier 112. First, the distortion and noise generated by amplifier 112 is isolated in the signal cancellation loop by, for example, subtracting the source signal 103 from the amplified output of amplifier 112. This signal is output from node 116 and is often referred to as the error signal. Next, the error signal is adjusted by adjuster 118, amplified by amplifier 119, and then, for example, subtracted at node 120 from the delayed (via delay element 117) amplified output signal of amplifier 112 which contains distortion and noise introduced by amplifier 112. As a result, the signal 104 output from the feed-forward amplifier system is intended to have reduced distortion and noise.

However, for some applications amplifier designs are required to be very robust to achieve the distortion and noise reduction required. This is particularly true for wideband and multi-carrier applications such as cellular telephone communications.

SUMMARY OF THE INVENTION

The present invention is directed to improving the quality of the signal output from a feed-forward amplifier system and/or allowing for reduction of the distortion and noise that results from the electrical characteristics of the amplifiers used in a feed-forward amplifier system. The present invention uses multiple adjusters in the signal cancellation loop of a feed-forward amplifier system so as to more accurately adjust the different frequencies within a frequency band. For example, in a multi-carrier feed-forward amplifier system two or more adjusters are provided in the signal cancellation loop so as to provide more accurate adjustment for the various carriers rather than relying on a single adjuster to adjust for all carriers.

According to one variation of the invention, two adjusters are provided in the signal cancellation loop of a two carrier multi-carrier feed-forward amplifier system. Each of the two adjusters is directed to adjusting a respective one of the two carriers. The outputs of the adjusters are combined and input to a delay element in the signal cancellation loop. According to another variation of the invention, the outputs of the adjusters are combined and input to the amplifier in the signal cancellation loop.

As a result of using two or more separate adjuster devices, one (or more) for each carrier, all of the carriers may be adjusted to be cancelled as precisely as one carrier can be cancelled in a single carrier amplifier with a single adjuster. This eases the amplitude and phase response requirements of the main amplifier and reduces the maximum output power of the auxiliary amplifier. As a result, the design and manufacture of the main amplifier becomes easier and lowers its cost. Further, the auxiliary amplifier can be made smaller and efficiency of the feed forward amplifier increases.

Other features and advantages of the invention will become apparent through the following description, the figures, and the claims.

DESCRIPTION OF THE PREFERRED EMBODIMENTS

Figure 1:
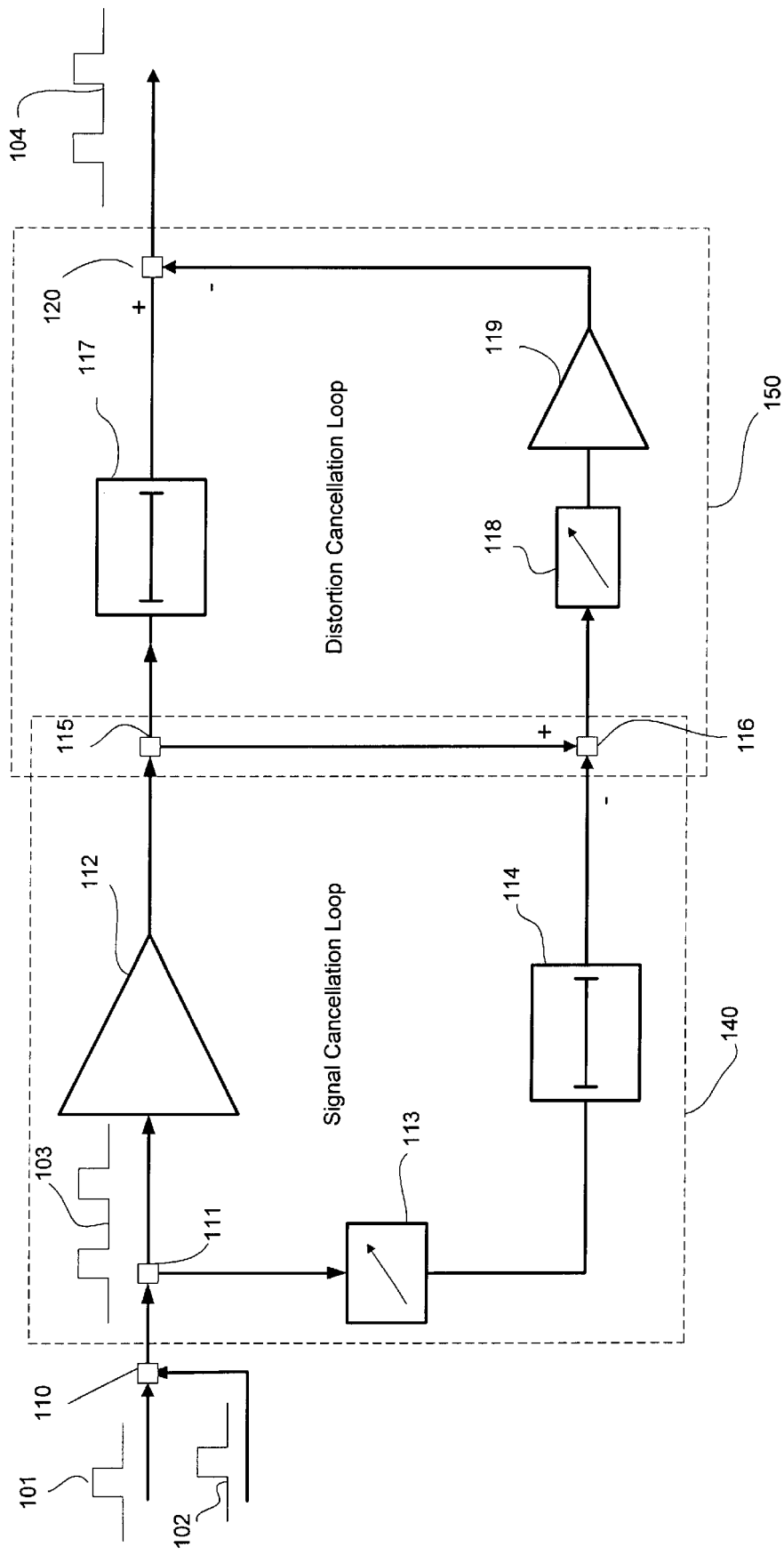
FIG. 1 illustrates a prior art feed-forward amplifier system.

The accuracy of matching the amplitude and phase response of the amplifier signal path and the delay element signal path in the signal cancellation loop of a feed-forward amplifier system in great part determines the extent to which the distortion and noise of the amplified signals may be reduced for a given auxiliary (error) amplifier. However, sufficient matching of the amplitude and phase response of the amplifier signal path and the delay element signal path in the signal cancellation loop is more difficult to achieve for broader bandwidth applications than in small frequency bandwidths because amplifiers generally have amplitude and phase response that varies non-linearly as a function of frequency.

In the signal cancellation loop of a feed-forward amplifier the amplitude and phase responses of signals in the two separate paths (one path via the amplifier and one path via the delay element) should match one another as close as possible so as to get good cancellation of the carrier(s). In the ideal situation the two paths will be matched leaving only the distortion and noise to be adjusted and amplified in the distortion cancellation loop of the feed-forward amplifier system. If the carrier(s) are not cancelled perfectly as a result of the amplitude and phase response of the two paths in the signal cancellation loop not matching, the power of the residual carrier(s) ("leaking" carrier(s)) will waste the power of the amplifier in the distortion cancellation loop. One of the limiting factors of feed-forward amplifier's ability to reduce distortion and noise from the output signal, is the maximum power that the amplifier in the distortion cancellation loop can deliver while operating linearly. Therefore, the more perfectly matched the amplitude and phase response of signals in the amplifier path and the delay path of the signal cancellation loop throughout the band of frequencies of the signals to be amplified, the more completely cancelled will be the carrier signal(s), and the less output power required from the amplifier of the distortion cancellation loop. The less power required from the amplifier of the distortion cancellation loop, the more linearly the distortion and noise signal is being amplified, and thus the more perfectly the distortion and noise signal can be subtracted from the output signal of the feed-forward amplifier system, and the better the performance and efficiency of the system.

As alluded to above, sufficient cancellation can be achieved more easily for a small frequency band. It becomes increasingly more difficult to match the amplitude and phase response of the two signal paths in the signal cancellation loop as the bandwidth of the application increases. This is mainly due to non-ideal (non-linear as a function of frequency) amplitude and phase responses of the amplifier in the signal cancellation loop. In single carrier amplifiers sufficient matching may be achieved with careful amplifier design, but with multi-carrier amplifiers this becomes a problem because of the wider bandwidth.

The present invention uses multiple adjusters in the signal cancellation loop of a feed-forward amplifier system so as to more accurately adjust the different frequencies within a frequency band. In a wideband application the present invention includes two or more adjusters in the signal cancellation loop of a feed-forward amplifier system. For example, if there are two or more carrier signals then each of the two or more adjusters adjusts a respective carrier.

In an alternative embodiment having a multi-carrier feed-forward amplifier system, two or more adjusters are provided in the signal cancellation loop so as to provide more accurate adjustment for the various carriers rather than relying on a single adjuster to adjust for all carriers. According to one variation of the invention, two adjusters are provided in the signal cancellation loop of a two carrier multi-carrier feed-forward amplifier system. Each of the two adjusters is directed to adjusting a respective one of the two carriers. The outputs of the adjusters are combined and input to a delay element in the signal cancellation loop. According to another alternative embodiment of the invention, the outputs of the adjusters are combined and input to the amplifier in the signal cancellation loop.

By using two or more separate adjuster devices in the signal cancellation loop one can better adjust the entire band of frequency being amplified. For example, in the multi-carrier application the use of one adjuster for each carrier results in all the carriers being cancelled as precisely as one can be cancelled in a single carrier amplifier. As a result, the present invention can ease the amplitude and phase response requirements of a main amplifier in the signal cancellation loop and reduce the maximum output power requirements of the auxiliary amplifier in the distortion cancellation loop of the feed-forward amplifier system and/or provide improved reduction of distortion and noise. If one chooses to ease the requirements of the amplifiers, the design and manufacturing of the main amplifier becomes easier and cheaper while the auxiliary amplifier can be made smaller. Overall, the design, manufacture, and electrical efficiency of the feed-forward amplifier system can be improved by including multiple adjusters in the signal cancellation loop. This is particularly true when the present invention is used in wideband (e.g., wideband code division multiple access (WCDMA)) or multiple carrier applications. Some applications may include, for example, cellular communications, satellite communications, terrestrial microwave radio systems, etc.

A few detailed embodiments of the invention are provided below to more clearly explain certain aspects of the invention. However, one skilled in the art will recognize that these embodiments are intended to be exemplary and the invention is not limited merely to these detail examples.

Figure 2:
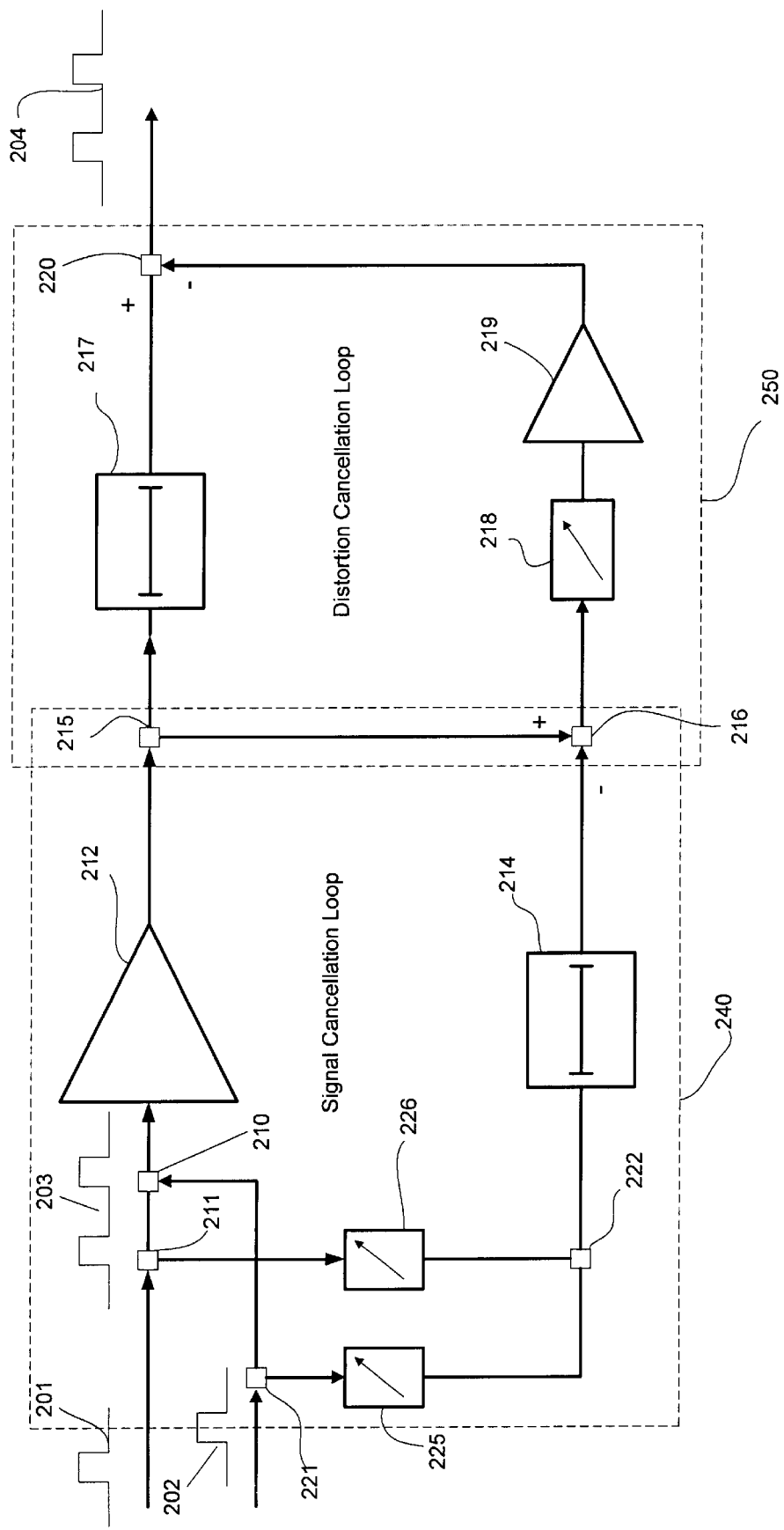
FIG. 2 illustrates a first embodiment of a feed-forward amplifier system, according to the invention.

A first exemplary embodiment of the present invention feed-forward amplifier system for a two carrier situation is provided in FIG. 2. This embodiment shows a feed-forward amplifier system having two carrier signals, carrier signal 201 and carrier signal 202 having two different frequencies input into a coupler 210, for example a combiner, to produce the combined signal 203. Combined signal 203 is provided to an amplifier 212, for example a main amplifier. Carrier signal 201 is also provided through a node or coupler 211, for example a splitter or divider, to an adjuster 226 in signal cancellation loop 240. The adjuster 226 may contain, for example, separate amplitude and phase adjusters or a vector regulator which is designed to accurately adjust the phase and amplitude expected for carrier signal 201. On the other hand, carrier signal 202 is also provided through a node or coupler 221, for example a splitter or divider, to an adjuster 225 in signal cancellation loop 240. The adjuster 225 may include, for example, amplitude and phase adjusters or a vector regulator which is designed to accurately adjust the phase and amplitude expected for carrier signal 202. The outputs of adjusters 225 and 226 are input through node 222 to delay element 214, for example a delay line, and output therefrom to node 216. Node 216 may be a directional coupler or a divider/combiner. Thus, according to this embodiment of the present invention each carrier signal, 201 and 202, is provided with its own adjuster, 226 and 225, respectively.

Further, as illustrated in FIG. 2, the feed-forward amplifier system of the present invention has the output of amplifier 212 provided through node or coupler 215 to a delay element 217, for example a delay line, and to a coupler 216. Nodes 211 and 215 may be a direct electrical connection or a coupler, e.g., a directional coupler, a directional splitter, a hybrid coupler, etc. Nodes 211 and 221, coupler 210, amplifier 212, node 215, coupler 216, adjusters 225 and 226, coupler 222, and delay element 214 make up a Signal Cancellation Loop 240 of the present invention. According to the present invention the output of the signal cancellation loop 240 from coupler 216 results in improved reduction of the carrier signals of the combined carrier signals, signal 203, which are removed and thus results in an error signal that contains only the distortion and noise produced that results from the imperfect amplification and inter-modulation products of amplifier 212.

The distortion cancellation loop of the feed-forward amplifier systems for this embodiment of present invention includes an auxiliary amplifier for amplifying the error signal output from node 216 which is then combined with the combined carrier signal 203 amplified by main amplifier 212 so as to remove the distortion and noise introduced into the signal as a result of the non-linear characteristics of main amplifier 212. The output of node 215 is input to delay element 217, for example a delay line, and output therefrom to coupler 220. The output of coupler 216 is input to adjuster 218. The adjuster 218 is, for example, an amplitude and phase adjuster or a vector regulator. The output of adjuster 218 is input to amplifier 219, for example an auxiliary (error) amplifier which amplifies the adjusted distortion and noise component of the signal amplified by amplifier 212. The output of amplifier 219 is input to coupler 220. Coupler 220 may be a directional coupler and may be made to add or subtract. Node 215, coupler 216, adjuster 218, amplifier 219, delay element 217, and coupler 220 make up distortion cancellation loop 250 which operates to remove the distortion and noise component from the output signal of amplifier 212 to produce amplified signal 204 which has improved reduction of distortion and noise.

In operation, the feed-forward amplifier system operates to remove the distortion, e.g., IMD, and noise that would normally occur as a result of the non-ideal characteristics and inter-modulation products of amplifier 212 operating alone. First, the distortion and noise generated by amplifier 212 is isolated in the signal cancellation loop 240 by, for example, subtracting the combined carrier source signal 203 from the amplified output of amplifier 212 (including distortion and noise) to produce an error signal. This signal is output from coupler 216 and is often referred to as the error signal. In this case, the two adjusters, 225 and 226, adjust for example the amplitude and phase of their respective carrier signals, 202 and 201, so that the error signal output from coupler 216 has improved reduction in the amount of residual carrier signal components in the error signal so that the signal output from coupler 216 is more closely pure distortion and noise. Next, the error signal output from coupler 216 is adjusted by adjuster 218, amplified by amplifier 219, and then, for example, subtracted at coupler 220 from the delayed (via delay element 217) amplified output signal of amplifier 212 which contains distortion and noise. As a result, the signal 204 output from the feed-forward amplifier system has an improved reduction of distortion and noise.

Sufficient cancellation can be achieved easily for a small frequency band, but when the bandwidth increases, it becomes more difficult to match the main amplifier 212 and delay element 214 branches of the signal cancellation loop 240. This is mainly due to the non-linear characteristics (non flat in a function of frequency) amplitude and phase responses of the main amplifier 212. In a single carrier amplifier, for example a single carrier WCDMA, this may be handled with careful amplifier design, but with multi-carrier amplifier this becomes more of a problem. For example, to achieve cancellation of 32 dB amplitude mismatch has to be smaller than 0.15 dB and phase error smaller than 1 degree. This is attainable, e.g., over a bandwidth of 4 MHz which is the bandwidth of one WCDMA carrier, but for a multiple carrier case the bandwidth can expand to 20 MHz or even 60 MHz. Maintaining gain flatness of 0.15 dB over a bandwidth of 60 MHz for a multi-stage amplifier is not easy, particularly for an RF power amplifier. Thus, the present invention is very useful for multiple carrier situations decreasing the flatness/bandwidth requirement of the main amplifier back down to the requirements needed for a single carrier feed-forward amplifier's main amplifier.

Although the simplified block diagram feed-forward amplifier system of FIG. 2 illustrates only two carriers, one skilled in the art will understand that it is instructive for a multi-carrier system having any number of carrier signals. Further, each of the multiple adjusters may be directed to more than one carrier signal or a broad frequency range of a wideband signal to be amplified. For example, if there are ten carrier signals two adjusters could be used in the signal cancellation loop, each directed at adjusting for one or more of the ten carriers according to the present invention. Thus, the feed-forward amplifier design could use one adjuster in the signal cancellation loop for a wide range of frequency where the distortion and noise from the main amplifier is less and another adjuster where the distortion and noise from the main amplifier is more.

One skilled in the art would also recognize that the multiple adjusters may be located at various locations within the signal cancellation loop 240 according to the present invention and that the adjusters may be of a type which is adjusted manually or automatically. Some examples of systems for automatically adjusting the adjusters is shown in U.S. Pat. No. 5,051,704 issued to Chapman et. al., incorporated herein by reference for all purposes. One particular system using automatically adjustable adjusters for adjusters 225 and 226 could use fully separate measurement and control circuitry for adjusting the adjusters. Alternatively, a common measurement and control circuit could be used to adjust the adjusters by adjusting both adjusters by the same amount based on alternating measurements of each respective carrier signal. Further, the feed-forward amplifier system could include a predistortion stage before the main amplifier. Another possible arrangement is shown in FIG. 3.

Figure 3:
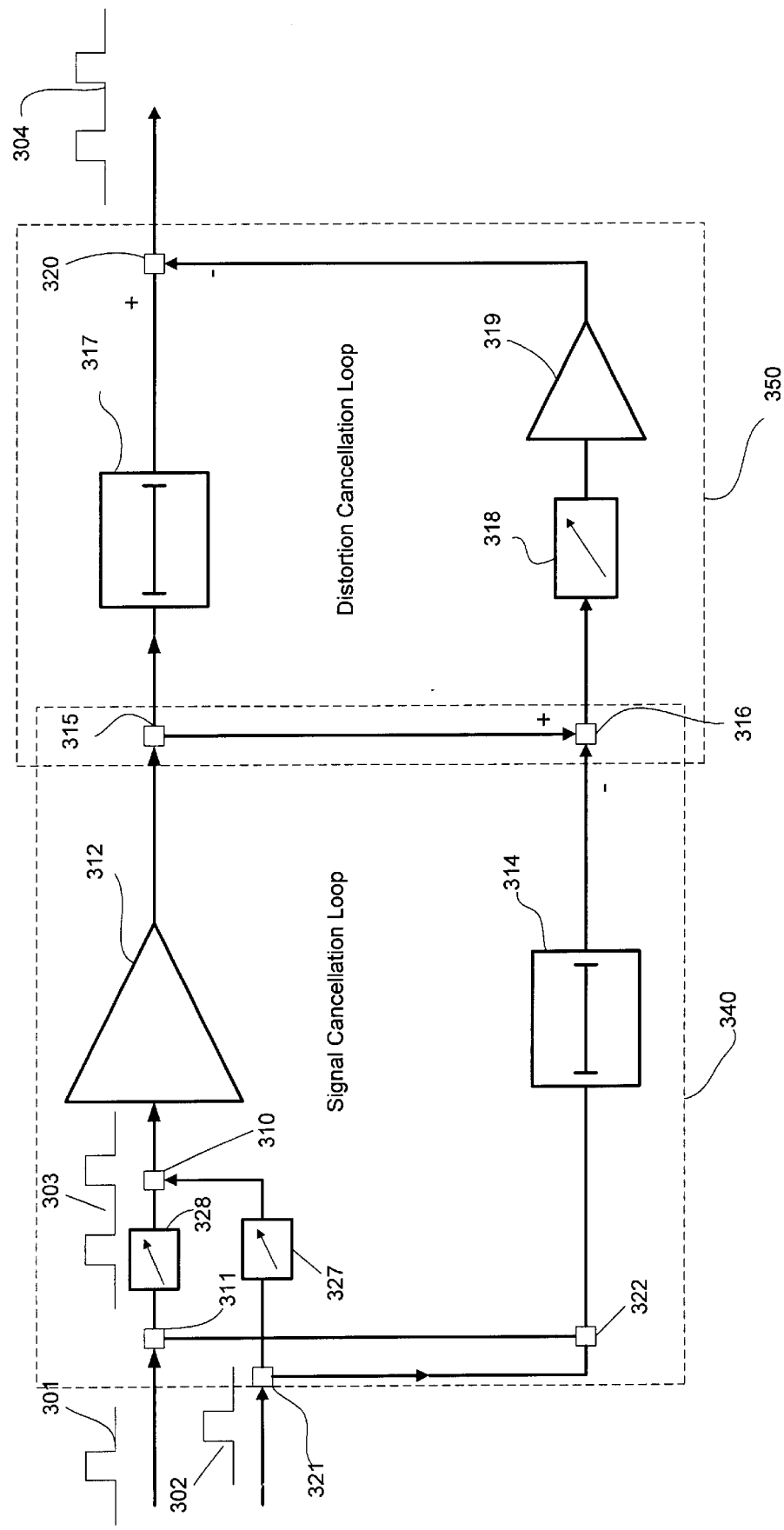
FIG. 3 illustrates a second embodiment of a feed-forward amplifier system, according to the invention.

A second exemplary embodiment of the present invention feed-forward amplifier system for a two carrier situation is provided in FIG. 3. This embodiment shows a feed-forward amplifier system having two carrier signals, carrier signal 301 and carrier signal 302 having two different frequencies input into a node or coupler 310, for example a combiner, to produce the combined signal 303. Combined signal 303 is provided to an amplifier 312, for example a main amplifier. Prior to being input to node or coupler 310, carrier signals 301 and 302 are input to adjusters 328 and 327, respectively. Adjusters 327 and 328 in signal cancellation loop 340 operate in a similar manner to adjusters 225 and 226 of the first exemplary embodiment. The adjusters 327 and 328 are, for example, amplitude and phase adjusters or vector regulators which are designed to accurately adjust the frequency and amplitude expected for carrier signals 302 and 301, respectively. The adjusters may be manually or automatically adjustable.

Carrier signals 301 and 302 are also provided through nodes or couplers 311 and 321, for example splitters or dividers, to a node 322. The output of node 322 is input to delay element 314, for example a delay line, and output therefrom to coupler 316. Node or coupler 316 may be a directional coupler and may be made to add or subtract. Thus, according to this embodiment of the present invention each carrier signal, 301 and 302, is provided with its own adjuster, 328 and 327, respectively.

Further, as illustrated in FIG. 3, the feed-forward amplifier system of the present invention has the output of amplifier 312 provided through node or coupler 315 to a delay element 317, for example a delay line, and to a coupler 316. Nodes 311, 315 and 321 may be a direct electrical connection or a coupler, e.g., a directional coupler, a directional splitter, a hybrid coupler, etc. Nodes 311 and 321, coupler 310, amplifier 312, node 315, coupler 316, adjusters 327 and 328, coupler 322, and delay element 314 make up a signal cancellation loop 340 of the present invention. According to the present invention the output of the signal cancellation loop 340 from coupler 316 results in improved reduction of the carrier signals of the combined carrier signals, signal 303, which are removed and thus results in an error signal that contains only the distortion and noise produced that results from the imperfect amplification and inter-modulation products of amplifier 312.

The distortion cancellation loop of the feed-forward amplifier systems for this embodiment of the present invention includes an auxiliary amplifier for amplifying the error signal output from node 316 which is then combined with the combined carrier signal 303 amplified by main amplifier 312 so as to remove the distortion and noise introduced into the signal as a result of the non-linear characteristics of main amplifier 312. The output of node 315 is input to delay element 317, for example a delay line, and output therefrom to coupler 320. The output of coupler 316 is input to adjuster 318. The adjuster 318 is, for example, an amplitude and phase adjuster or a vector regulator. The output of adjuster 318 is input to amplifier 319, for example an auxiliary amplifier or an error amplifier which amplifies the adjusted distortion and noise component of the signal amplified by amplifier 312. The output of amplifier 319 is input to coupler 320. Coupler 320 may be a directional coupler and may be made to add or subtract. Node 315, coupler 316, adjuster 318, amplifier 319, delay element 317, and coupler 320 make up distortion cancellation loop 350 which operates to remove the distortion and noise component from the output signal of amplifier 312 to produce amplified signal 304 which has improved reduction of distortion and noise.

In operation, the feed-forward amplifier system operates to remove the distortion, e.g., IMD, and noise that would normally occur as a result of the non-ideal characteristics and inter-modulation products of amplifier 312 operating alone. First, the distortion and noise generated by amplifier 312 is isolated in the signal cancellation loop 340 by, for example, subtracting the combined carrier source signal 303 from the amplified output of amplifier 312 (including distortion and noise) to produce an error signal. This signal is output from coupler 316 and is often referred to as the error signal. In this case, the two adjusters, 327 and 328, adjust for example the amplitude and phase of their respective carrier signals, 302 and 301, so that the error signal output from coupler 316 has improved reduction in the amount of residual carrier signal components in the error signal so that the signal output from coupler 316 is more closely pure distortion and noise. Next, the error signal output from coupler 316 is adjusted by adjusted 318, amplified by amplifier 319, and then, for example, subtracted at coupler 320 from the delayed (via delay element 317) amplified output signal of amplifier 312 which contains distortion and noise. As a result, the signal 304 output from the feed-forward amplifier system has an improved reduction of distortion and noise.

Although a particular embodiments of the present invention have been shown and described, it will be understood that it is not intended to limit the invention to the preferred embodiments and it will be obvious to those skilled in the art that various changes and modifications may be made without departing from the spirit and scope of the present invention. Thus, the invention is intended to cover alternatives, modifications, and equivalents, which may be included within the spirit and scope of the invention as defined by the claims. For example, the present invention is applicable to any application in which improved distortion and noise reduction would occur as a result of adding multiple adjusters, directed to a portion of the amplified signal frequency band, to an amplifier system. Further, if the invention is used with RF frequency signals, all nodes may be directional couplers or other types of dividers/combiners.

All publications, patents, and patent applications cited herein are hereby incorporated by reference in their entirety for all purposes.

What is claimed is:

1. An amplifier system including a signal-cancellation loop and a distortion-cancellation loop, comprising:
   an amplifier in the signal-cancellation loop;
   a first adjuster, located in the signal cancellation loop, that adjusts a frequency of at least a portion of a first carrier signal, wherein distortion-cancellation-loop signals are not fed back to the first adjuster; and
   a second adjuster, located in the signal cancellation loop, that adjusts a frequency of at least a portion of a second carrier signal, wherein distortion-cancellation-loop signals are not fed back to the second adjuster.

2. The amplifier system of claim 1 wherein said first adjustment amplitude and phase adjuster.

3. The amplifier system of claim 2 wherein said second adjuster is an amplitude and phase adjuster.

4. The amplifier system of claim 1, wherein an output of said first adjuster and an output of said second adjuster input to said amplifier.

5. The amplifier system of claim 3, wherein an output of said first adjuster and an output of said second adjuster input to said amplifier.

6. The amplifier system of claim 1, wherein said amplifier system is a feed forward amplifier system.

7. An amplifier system, comprising:
   an amplifier;
   a first adjuster, located in a signal cancellation loop with said amplifier, that adjusts a first portion of a frequency band;
   second adjuster, located in said signal cancellation loop, that adjusts a second portion of said frequency band;
   a delay element;
   an output of said first adjuster input to said delay element; and
   an output of said second adjuster input to said delay element.

8. An amplifier system, comprising:
   an amplifier;
   a first amplitude and phase adjuster, located in a signal cancellation loop with said amplifier, that adjusts a first portion of a frequency band;
   a second amplitude and phase adjuster, located in said signal cancellation loop, that adjusts a second portion of said frequency band;

a delay element;

an output of said first adjuster input to said delay element; and an output of said second adjuster input to said delay element.

9. A feed-forward amplifier system, comprising:

a signal cancellation loop;

a distortion cancellation loop;

a plurality of adjusters included in said signal cancellation loop;

wherein each of said plurality of adjusters adjusts the frequency of a separate carrier signal; and wherein distortion-cancellation-loop signals are not fed back to the adjusters.

10. A method for amplifying a signal, comprising the steps of:

providing an amplifier in a signal cancellation loop of a feed-forward amplifier having a distortion-cancellation loop;

adjusting a first carrier signal with a first adjuster located in said signal cancellation loop, wherein the first adjuster does not receive feedback from the distortion-cancellation loop; and adjusting a second carrier signal with a second adjuster located in said signal cancellation loop, wherein the second adjuster does not receive feedback from the distortion-cancellation loop.

11. A wireless telecommunication transmitter with a feed-forward amplifier system, comprising:

a signal cancellation loop;

a distortion cancellation loop;

a plurality of adjusters included in said signal cancellation loop;

wherein each of said adjusters separately adjusts a carrier signal; and wherein distortion-cancellation-loop signals are not fed back to the adjusters.

12. The wireless telecommunication transmitter with a feed-forward amplifier system of claim 11, wherein said plurality of adjusters includes an adjuster for each of a plurality of carrier signals.

13. The wireless telecommunication transmitter with a feed-forward amplifier system of claim 12, wherein the plurality of adjusters includes a first adjuster located in said signal cancellation loop for adjusting a first portion of a frequency band and a second adjuster located in said signal cancellation loop for adjusting a second portion of said frequency band.

14. The method of claim 10, wherein the steps of adjusting said fist and second carrier signals comprise amplitude and phase adjustments.

15. The method of claim 14, wherein said steps of adjusting are performed automatically.

* * * * *